United States Patent
Chao et al.

(10) Patent No.: US 7,902,554 B2
(45) Date of Patent: Mar. 8, 2011

(54) POLYSILICON FILM HAVING SMOOTH SURFACE AND METHOD OF FORMING THE SAME

(75) Inventors: Chih-Wei Chao, Taipei (TW); Ming-Wei Sun, Hsinchu County (TW)

(73) Assignee: AU Optronics Corp., Hsin-Chu (TW)

( * ) Notice: Subject to any disclaimer, the term of this patent is extended or adjusted under 35 U.S.C. 154(b) by 124 days.

(21) Appl. No.: 12/138,490

(22) Filed: Jun. 13, 2008

(65) Prior Publication Data

US 2009/0026465 A1 Jan. 29, 2009

Related U.S. Application Data

(62) Division of application No. 11/539,650, filed on Oct. 9, 2006, now Pat. No. 7,410,878.

(30) Foreign Application Priority Data

Apr. 17, 2006 (TW) .............................. 95113683 A

(51) Int. Cl.
*H01L 29/04* (2006.01)
(52) U.S. Cl. .................................. 257/75; 257/E33.004
(58) Field of Classification Search .................. 438/487; 257/70, 75, E33.004
See application file for complete search history.

(56) References Cited

U.S. PATENT DOCUMENTS

| | | | |
|---|---|---|---|
| 5,621,224 A | | 4/1997 | Yamazaki et al. |
| 6,113,689 A | | 9/2000 | Moon |
| 6,190,949 B1 | * | 2/2001 | Noguchi et al. ............. 438/149 |
| 6,602,758 B2 | | 8/2003 | Kizilyalli et al. |
| 6,645,454 B2 | | 11/2003 | Voutsas |
| 6,867,074 B2 | | 3/2005 | Tsao |
| 6,979,632 B1 | * | 12/2005 | Ohtani et al. ................. 438/487 |
| 7,358,165 B2 | * | 4/2008 | Shoji et al. .................... 438/487 |
| 2002/0039831 A1 | * | 4/2002 | Usuda .......................... 438/479 |

FOREIGN PATENT DOCUMENTS

CN 1848365 10/2006

* cited by examiner

*Primary Examiner* — Chandra Chaudhari
(74) *Attorney, Agent, or Firm* — Thomas, Kayden, Horstemeyer & Risley

(57) ABSTRACT

A method of forming a polysilicon film having smooth surface using a lateral growth and a step-and-repeat laser process. Amorphous silicon formed in a first irradiation region of a substrate is crystallized to form a first polysilicon region by a first laser shot. Then, the substrate is moved a predetermined distance, and irradiated by a second laser shot. The polysilicon region is then recrystallized and locally planarized by subsequent laser shots. After multiple repetitions of the irradiation procedure, the amorphous silicon film formed on a substrate is completely transformed into a polysilicon film. The polysilicon film includes lateral growth crystal grains and nano-trenches formed in parallel on the surface of the polysilicon film. A longitudinal direction of the nano-trenches is substantially perpendicular to a lateral growth direction of the crystal grains.

16 Claims, 7 Drawing Sheets
(2 of 7 Drawing Sheet(s) Filed in Color)

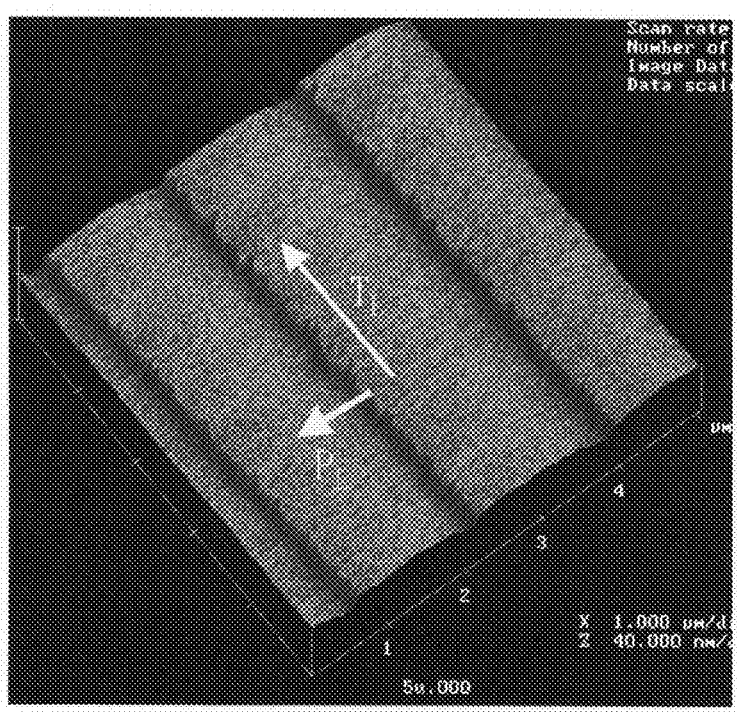
FIG. 8
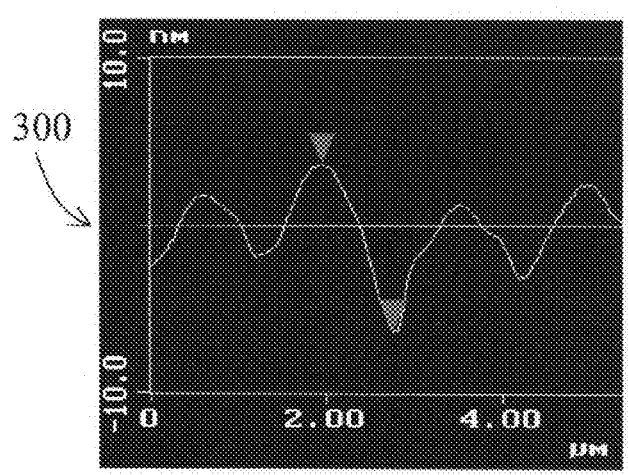 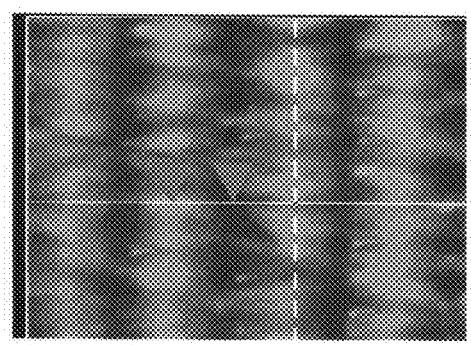
FIG. 9A  FIG. 9B

US 7,902,554 B2

POLYSILICON FILM HAVING SMOOTH SURFACE AND METHOD OF FORMING THE SAME

CROSS REFERENCE TO RELATED APPLICATIONS

This application is a Divisional of U.S. application Ser. No. 11/539,650, filed Oct. 9, 2006.

BACKGROUND OF THE INVENTION

1. Field of the Invention

The invention relates in general to a polysilicon film and a method of forming the same, and more particularly to a polysilicon film having a smooth surface and to a method of forming the same.

2. Description of the Related Art

The techniques for manufacturing thin film transistor (TFT) on a glass substrate include the amorphous silicon (a-Si) process and the low-temp polysilicon (LTPS) process. The major differences between the a-Si process and the LTPS process are their complexity and the electrical characteristics of the manufactured devices. The LTPS TFT possesses higher mobility, but the process for fabricating the LTPS TFT is more complicated than that for fabricating the a-Si TFT.

Several methods, including the excimer laser annealing (ELA) method, the continuous grain silicon (CGS) method, the continuous wave (CW) laser method, the sequential lateral solidification (SLS) method and the metal induced lateral crystallization (MILC) method, have been developed to convert the amorphous silicon layer into a polysilicon film. A laser beam, such as one produced by an excimer laser, a continuous wave (CW) laser, or abeam pulse laser, can be used for irradiating the amorphous silicon layer. Recently, the beam pulse laser is commonly used, and the method of lateral crystallization by causing a temperature gradient is also popular.

Taking the sequential lateral solidification (SLS) method for example, the use of optical phase shift masks that have different transparency can cause a lateral temperature gradient in an amorphous silicon layer so as to induce lateral grain growth.

No matter what polysilicon film is used for fabricating the metal-oxide-semiconductor (MOS) device or TFT device, the surface roughness of the polysilicon film has a significant effect on the electrical reliability and uniformity of the device. Using the conventional laser annealing methods to convert the amorphous silicon into the polysilicon grains usually produces protrusions (or tips) on the surface of the polysilicon film, and therefore roughens the surface. The root mean square (RMS) roughness of the polysilicon film formed by the conventional laser annealing methods is in a range of approximately 7-9 nm. FIG. 1 shows a SEM (scanning electron microscope) image of a polysilicon sample annealed by the ELA method. The SEM image indicated that the height of the protrusions on the polysilicon surface is in the range of about 1000 Å to 1200 Å. FIG. 2 is perspective view, in the form of an AFM (atomic force microscope) image, of a polysilicon sample also annealed by the ELA method. The image of FIG. 2 clearly shows that a lot of protrusions project from the polysilicon's surface.

Therefore, a method for forming a polysilicon film having a smooth surface to improve the electrical reliability and uniformity of devices is desirable.

SUMMARY OF THE INVENTION

It is therefore an object of the invention to provide a method of forming a polysilicon film having a smooth surface, by using a lateral growth and a step-and-repeat laser process. According to this method, a first part of the amorphous silicon on a substrate is completely melted by a first laser shot, and then crystallizes to become polysilicon when the laser shot has ceased. Several poly-Si protrusions are also developed. The substrate is then moved in a predetermined step distance, and a second part of the amorphous silicon (which partially overlaps the first part) and the poly-Si protrusions are completely melted by a second laser shot, and become crystallized to form polysilicon again when the second laser shot has ceased. The procedure is repeated until the amorphous silicon film formed on the substrate is completely transformed into a polysilicon film.

The invention achieves this object of the invention by providing a method for forming a polysilicon layer, comprising steps of:

(a) forming an amorphous silicon layer on a substrate;

(b) irradiating a first irradiation area of the substrate by a first laser shot with sufficient energy to melt the amorphous silicon in the first irradiation area, whereupon the melted amorphous silicon crystallizes to form polysilicon;

(c) moving the substrate a distance d, and irradiating a second irradiation area of the substrate by a second laser shot with sufficient energy to melt amorphous silicon in the second irradiation area and a portion of the polysilicon in the first irradiation area overlapping the second irradiation area, whereupon the melted amorphous silicon and melted polysilicon crystallize and re-crystallize, respectively; and (d) repeating step (c) until the amorphous silicon layer on the substrate is transformed completely into a polysilicon film.

According to the method of the invention, a polysilicon layer formed on the substrate has lateral growth crystal grains and nano-trenches formed in parallel on a surface of the polysilicon layer. Also, a longitudinal direction of the nano-trenches is substantially perpendicular to the direction of growth of the lateral growth crystal grains.

Other objects, features, and advantages of the invention will become apparent from the following detailed description of the preferred but non-limiting embodiments. The following description is made with reference to the accompanying drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 8 is perspective view, in the form of an AFM image, of a polysilicon sample annealed according the preferred embodiment of the method of the invention.

FIGS. 9A and 9B are a graph and another AFM image, illustrating a polysilicon sample annealed by the preferred embodiment of the method of the invention.

DETAILED DESCRIPTION OF PREFERRED EMBODIMENTS

A polysilicon film, i.e. a polysilicon layer, formed according to the invention as described below has a smooth surface. The polysilicon film of the invention includes a plurality of lateral growth grains and parallel nano-trenches formed on the surface of the polysilicon film. The roughness of the polysilicon film formed by the method of the invention is less than that formed by the conventional method.

Additionally, an embodiment disclosed herein merely illustrates the invention, and the scope of the invention is not limited thereto. The drawings used for illustrating the embodiments of the invention show only the major characteristic parts in order to avoid obscuring the invention. Accordingly, the specification and the drawings are to be regarded in an illustrative sense rather than in a restrictive sense.

Figure 3A:
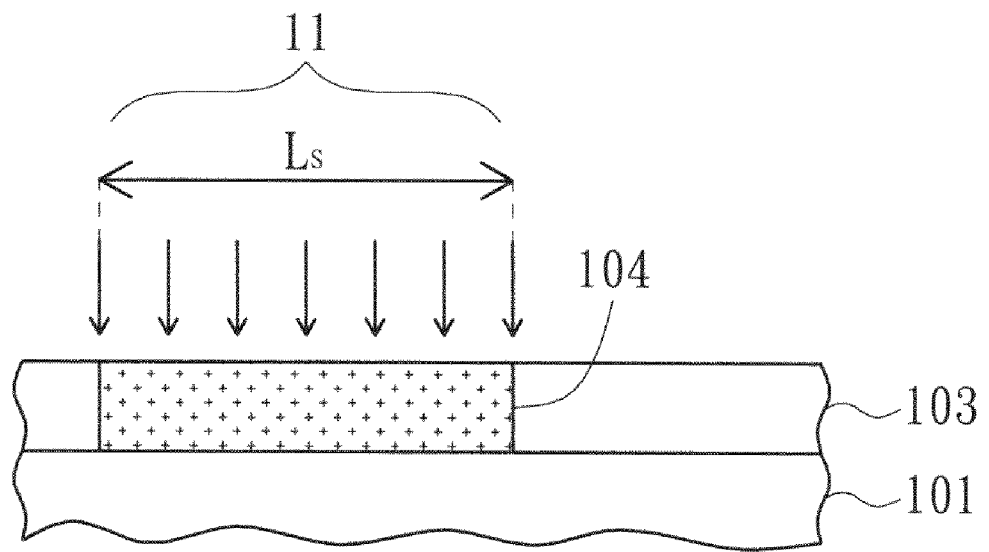
FIG. 3A~FIG. 3D illustrate a method of forming a polysilicon film according to a preferred embodiment of the invention.
Figure 3B:
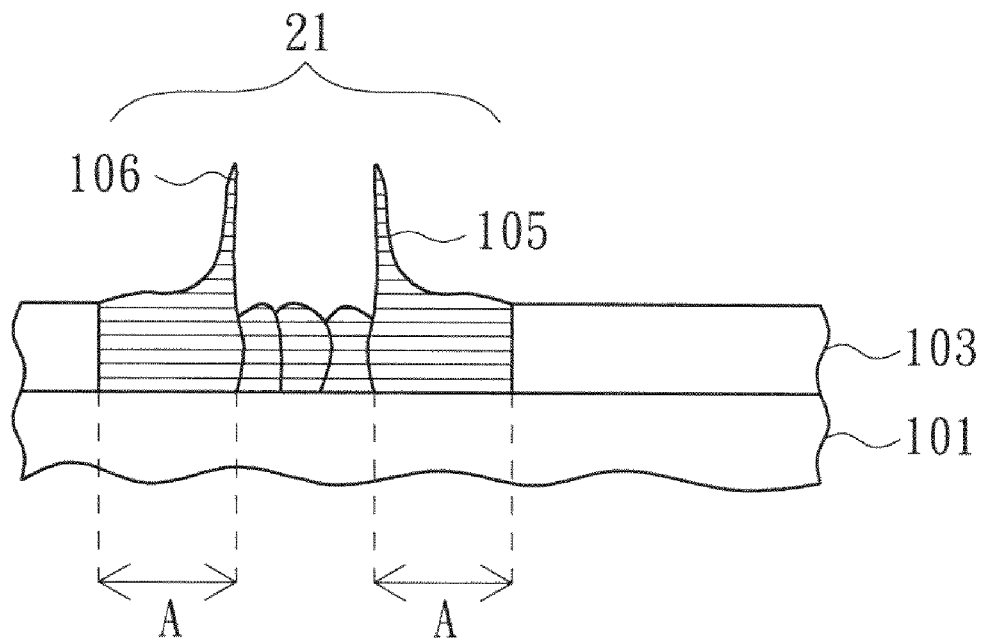
Figure 3C:
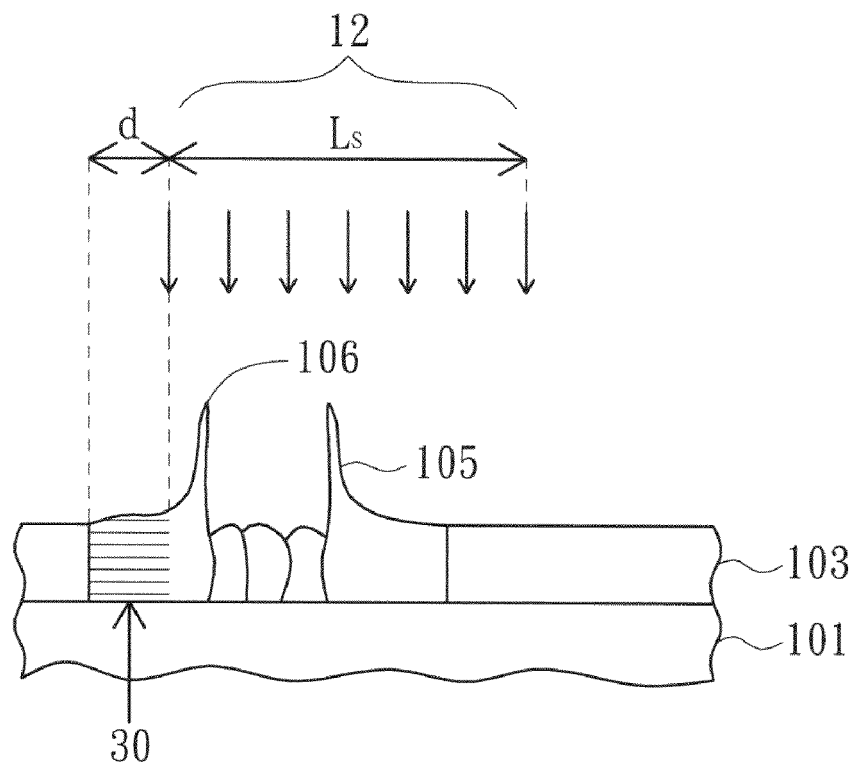
Figure 3D:
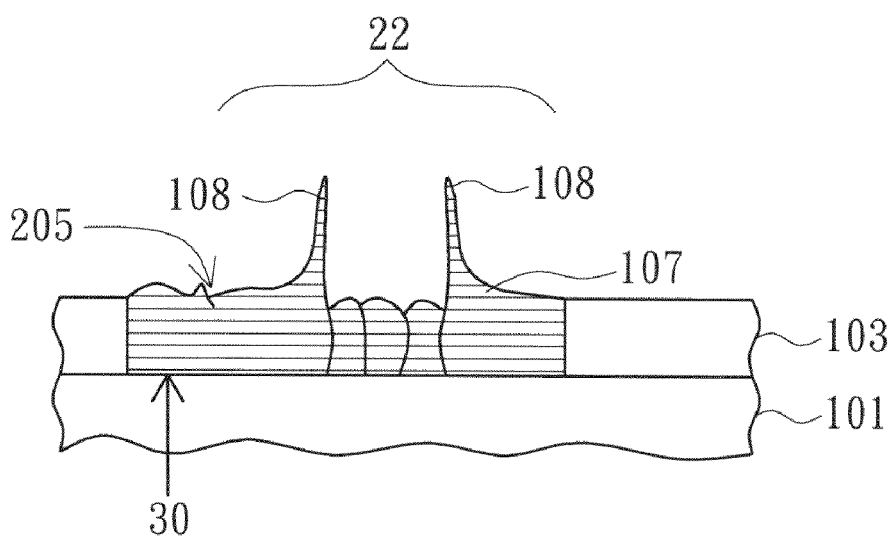
Figure 4:
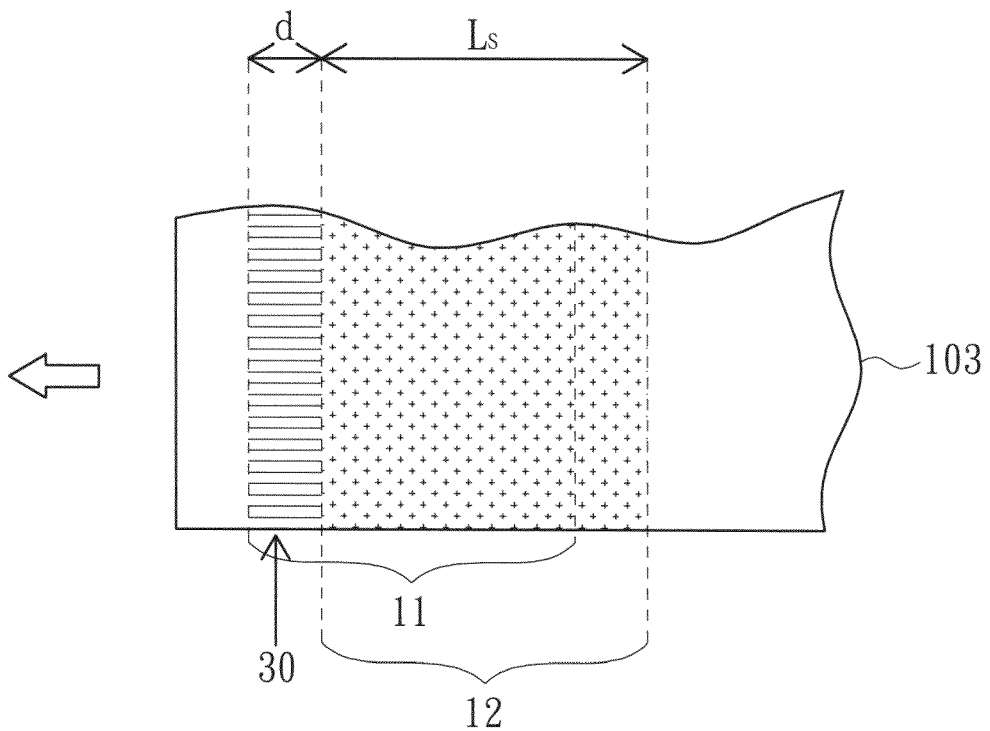
FIG. 4 is a top view of the polysilicon film formed by the method illustrated in FIG. 3A~FIG. 3D.

FIG. 3A~FIG. 3D illustrate a method of forming a polysilicon film according to a preferred embodiment of the invention. FIG. 4 is a top view of the polysilicon film formed by the method illustrated in FIG. 3A~FIG. 3D. First, a substrate 101 is provided, and an amorphous silicon layer 103 is formed on the substrate 101. Then, a first irradiation area 11 of the substrate 101 is irradiated by a first laser shot with sufficient energy to completely melt the amorphous silicon in the first irradiation area 11, as shown in FIG. 3A. The duration of the first laser shot should be long enough to completely melt portion of the amorphous silicon layer 103 in the first irradiation area 11. When the first laser shot ceases the melted amorphous silicon is crystallized from the edges to the center of the first irradiation area 11, so as to form a first polysilicon layer 105. As shown in FIG. 3B, "A" denotes a lateral growth length (defined as the distance crystals can grow laterally from the edges of the irradiation area), and the first polysilicon layer 105 within a first polysilicon region 21 develops the first poly-Si protrusions or tips 106.

The substrate 101 is then moved along the direction of the arrow in FIG. 4 in steps of distance d (to be described below), and after each step a melting and crystallization procedure similar to that described is repeated. Thus, following a first step of distance d from the position shown in FIG. 3A and FIG. 3B, a second irradiation area 12 of the substrate 101 is irradiated by a second laser shot with sufficient energy to melt or remelt the silicon, wherein the first irradiation area 11 and the second irradiation area 12 are partially overlapping, as shown in FIG. 3C. Preferably, the step of distance d is shorter than the lateral growth length A, in order to remelt the protrusions (or tips) 106. After the amorphous silicon layer 103 in the second irradiation area 12 and a portion of the first polysilicon layer 105 in the first irradiation area 11 are completely melted and the second laser shot has ceased, the melted amorphous silicon is crystallized from the edges to the center of the second irradiation area 12 so as to form a second polysilicon layer 107. As shown in FIG. 3D, the second polysilicon layer 107 within a second polysilicon region 22 develops the second poly-Si protrusions 108. Accordingly, a laterally grown polysilicon region 30 is developed, and the nano-trench 205 (i.e nanometers in depth) is formed at the boundary between the laterally grown polysilicon region 30 and second polysilicon region 22.

The procedures described above are repeated, until the amorphous silicon layer 103 is completely crystallized into a polysilicon layer with a smooth surface. For example, the substrate 101 is further moved by a step of distance d, and a third irradiation area of the substrate 101 is irradiated by a third laser shot with sufficient energy to remelt the amorphous silicon and polysilicon in the third irradiation area, and also to remelt the second poly-Si protrusions 108. When the third laser shot has ceased, the completely melted silicon grows laterally. According to the method of the invention, the poly-Si protrusions will move across the substrate 101 corresponding to the irradiation produced by the laser shots. Also, each laser shot after the first laser shot produces a laterally grown polysilicon region (e.g. region 30) and a nano-trench (e.g. nano-trench 205) at the surface of the polysilicon layer, successively spaced apart in the lateral direction.

It is noted that the step of distance d is in a range of about 0.5 μm~5 μm, and preferably about 2 μm ~5 μm. Also, the laser shot energy should be high enough sufficiently to melt the amorphous silicon layer 103 on the substrate 101. According to the invention, laser energy of fluence 900 J/cm$^2$ is applicable, and laser energy of fluence in a range of 1000 J/cm$^2$ to 1400 J/cm$^2$ is preferably used in practical applications. Conventional excimer laser irradiation with fluence of 350 to 450 is J/cm$^2$ is not enough completely to melt the amorphous silicon layer 103.

Figures 5A, 5B:
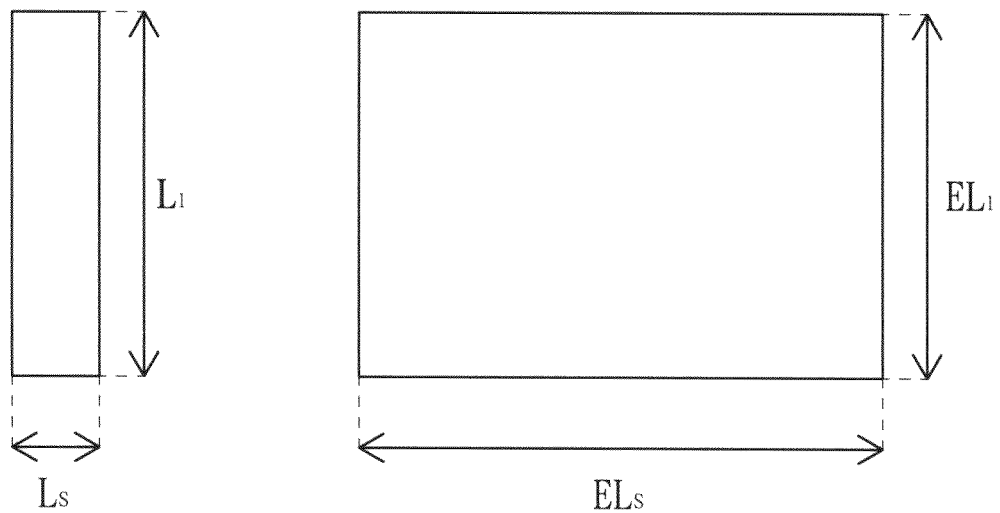
FIG. 5A and FIG. 5B are plan views illustrating a laser beam applied in the present invention and an excimer laser beam applied according to conventional laser annealing technology, respectively.

FIG. 5A and FIG. 5B are plan views respectively illustrating a laser beam applied according to the invention and an excimer laser beam applied in the conventional laser annealing technology. The width of the excimer laser beam $EL_S$ (FIG. 5B) is about 0.4 mm, which it is too broad to be used in the invention. According to the invention, the width of laser beam $L_S$ (FIG. 5A) is no more than about 100 μm, and preferably is less than 50 μm. The length of the excimer laser beam $EL_I$ (FIG. 5B) and the length of laser beam $L_I$ (FIG. 5A) are approximately equal to the length of the substrate 101.

Figure 6:
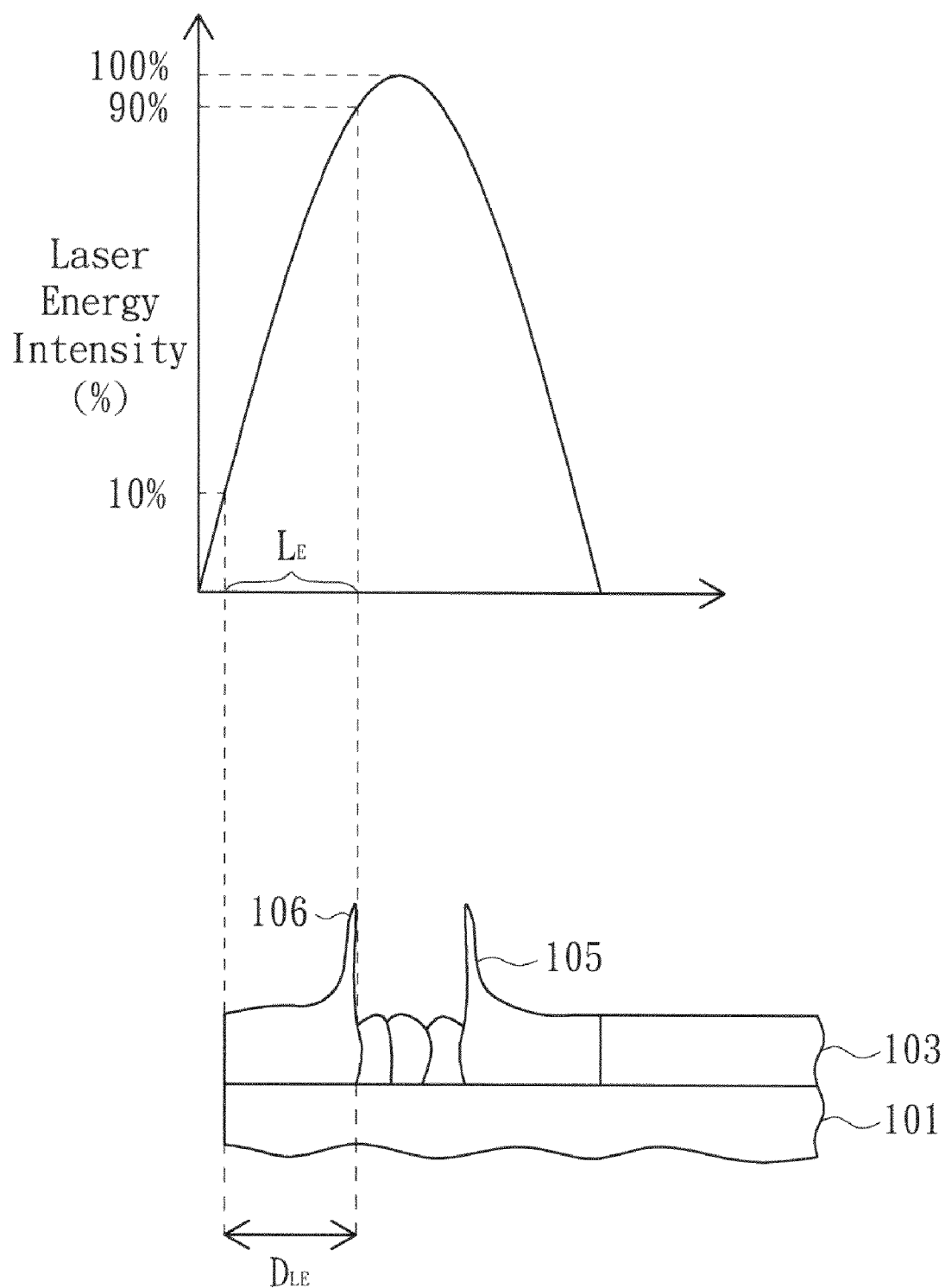
FIG. 6 illustrates a laser energy profile corresponding to the substrate according to the embodiment of the invention.

Additionally, the step of distance d corresponds to the profile of the laser energy for effective completion of the lateral growth. FIG. 6 illustrates a laser energy profile corresponding to the substrate according to the embodiment of the invention. $D_{LE}$, a lateral distance along the substrate 101 from where the intensity of the laser beam's energy impacting upon it is 10% of its maximum to where the intensity first reaches 90% of its maximum. Preferably, $D_{LE}$ is larger than the step of distance d (FIG. 3C and FIG. 4). For example, the lateral distance $D_{LE}$ will be larger than 2 μm if the distance d is 2 μm, and the lateral distance $L_E$ will be larger than 5 μm if the step of distance d is 5 μm.

Figure 7A:
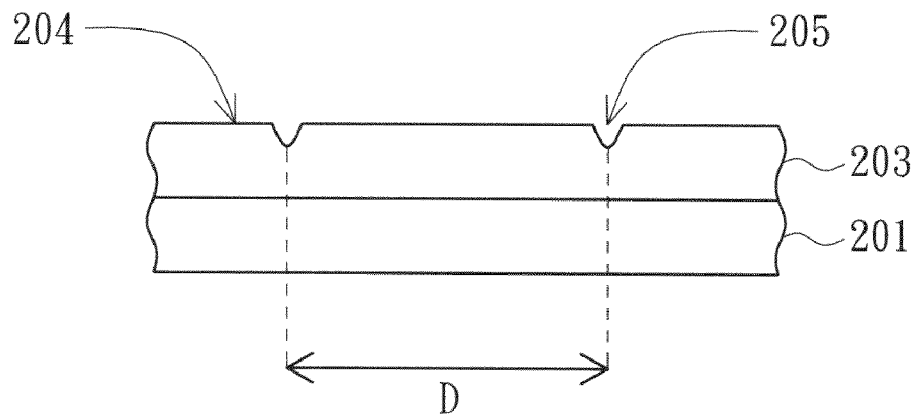
FIG. 7A and FIG. 7B respectively are cross-sectional view and perspective view of a polysilicon layer formed by the preferred embodiment of the method of the invention.
Figure 7B:
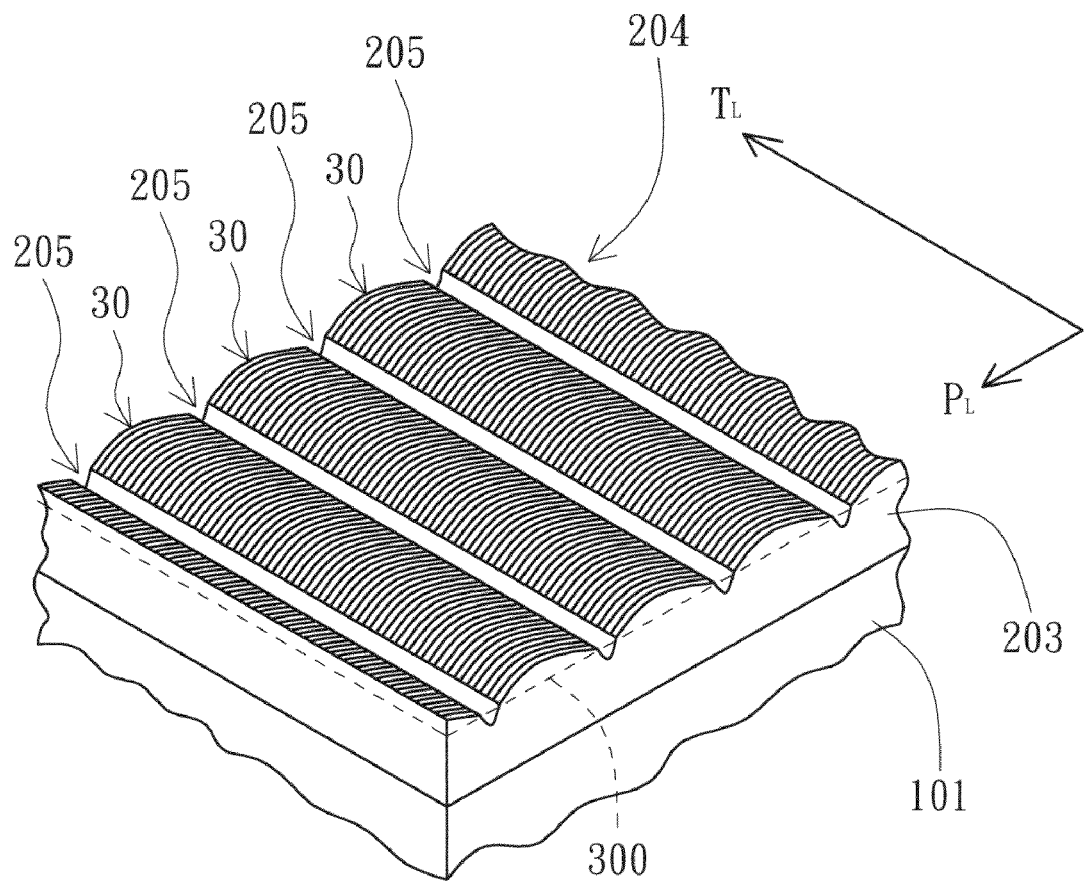

FIG. 7A and FIG. 7B, respectively, are a cross-sectional view and a perspective view of a polysilicon layer formed by the preferred embodiment of the method of the invention. The polysilicon layer 203 formed by the method of the invention has lateral growth crystal grains in the regions 30, and nano-trenches 205 respectively developed in parallel on the surface 204 of the polysilicon layer 203 at the boundaries of the successively adjacent laterally grown polysilicon regions 30. As can be seen in FIG. 7B, in the resulting polysilicon layer, from a plane 300 defined by the average height of its upper surface the surface falls sharply to define the trenches, and from the lateral sides of the trenches the surface gradually rises slightly above the defined plane 300. According to experimental results, the surface 204 of the polysilicon layer 203 has root-mean-square (RMS) roughness no greater than 5 nm, and in the vicinity of each nano-trench 205 the surface of the polysilicon layer will be at a height in a range of about −10 nm~+10 nm relative to the level of the plane 300. In other words, the nano-trench 205 is no greater than about 20 nm in depth. According to the aforementioned description, distance D (in FIG. 7A) between two adjacent nano-trenches 205 corresponds to the step of distance d, which is in a range of about 0.5 μm-5 μm. Since the distance d is related to the lateral distance $D_{LE}$ between 10% of laser energy intensity and 90% of laser energy intensity (as shown in FIG. 6), the lateral distance $D_{LE}$ preferably will be larger than the distance D.

Further, the longitudinal direction $T_L$ of the nano-trench 205 is substantially perpendicular to the lateral growth direction $P_L$ of crystal grains, as shown in FIG. 7B. Also, the longitudinal direction $T_L$ of the nano-trench 205 and the grain boundary of the polysilicon layer 203 form an angle in a range of about 60 degrees to 90 degrees.

Figure 1:
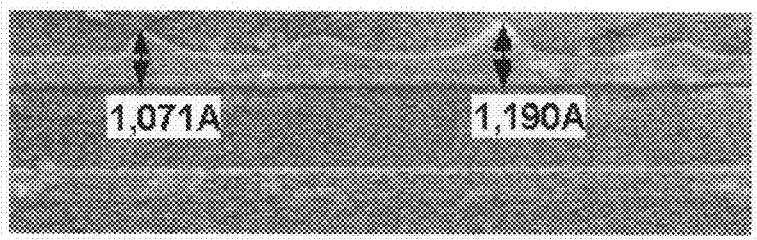
FIG. 1 shows a SEM image of a polysilicon sample annealed by the ELA method.
Figure 2:
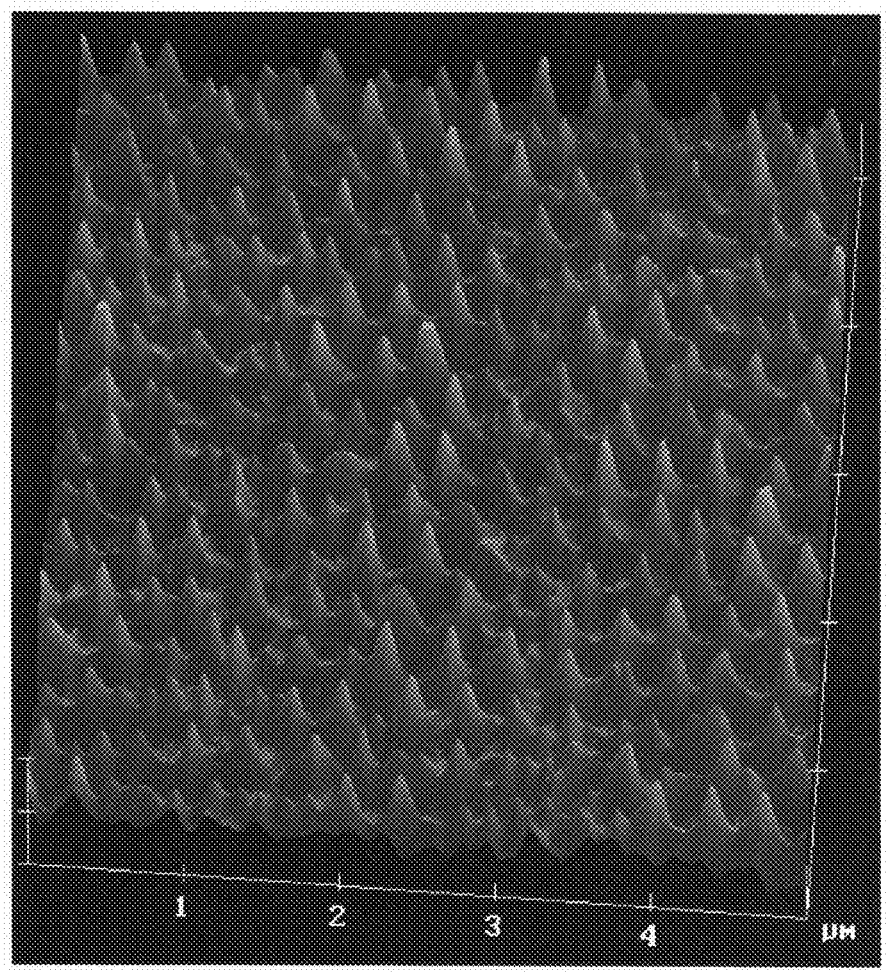
FIG. 2 is perspective view, in the form of an AFM image, of a polysilicon sample also annealed by the ELA method.

According to the invention, a laser beam utilized in the method according to the present embodiment has a shorter width (of less than 50 μm, preferably) than that of a laser beam used in the conventional ELA method. When a portion of the amorphous silicon on the substrate is irradiated by the first laser shot, the crystal grains grow laterally from the edges to the center so as to form the poly-Si protrusions. The substrate is then shifted by a step of distance d, and the amorphous silicon is irradiated by the second laser shot to completely melt the poly-Si protrusions. Repeating the step and laser shot procedure, the amorphous silicon can be laterally crystallized to a polysilicon layer with a smooth surface, and this is supported by experimental results. FIG. 8 is perspective view, in the form of an AFM (atomic force microscope) image, of a polysilicon sample annealed by the method according to the present embodiment. FIG. 8 clearly shows the surface of the polysilicon sample to be smooth (without any protrusions), and only several nano-trenches are formed in parallel on the surface. FIGS. 9A and 9B illustrate the contour of a polysilicon sample annealed by the method according to the present embodiment, wherein FIG. 9A shows the height of the polysilicon surface along the lateral direction and FIG. 9B is another AFM image of the polysilicon layer in plan view. As shown in FIGS. 9A and 9B, the uppermost and lowermost points of the polysilicon surface are +5 nm and −5 nm, respectively relative to the plane 300. The polysilicon sample annealed by the method according to the present embodiment has a surface smoother than that annealed by the conventional ELA method (see FIG. 2, with protrusions of 1000 Å to 1200 Å).

Additionally, TFT devices having polysilicon layers formed by the method according to the present embodiment were fabricated, and experiments were performed to determine their electrical properties. The experimental results listed in Table 1 indicate that the mobility increases from 108 to 301 cm²/V-S. Thus, generally, the uniformity and reliability of electrical characteristics of TFT devices having polysilicon layers formed by the method of the invention are improved over those formed by a conventional method.

TABLE 1

|  | Mobility | Threshold Voltage | Reciprocal of IV Curve Slope (SS) | $I_{off}$ |
| --- | --- | --- | --- | --- |
| TFT devices having polysilicon layers formed by the method according the invention | 301 cm²/V-S | 3.14 V | 0.19 | $5 \times 10^{-13}$ pA |
| TFT devices having polysilicon layers formed by conventional excimer laser annealing (ELA) | 108 cm²/V-S | 2.0 V | 0.22 | $3.76 \times 10^{-13}$ pA |

While the invention has been described by way of example and in terms of the preferred embodiment, it is to be understood that the invention is not limited thereto. On the contrary, the invention covers various modifications and similar arrangements and procedures, and the scope of the appended claims therefore should be accorded the broadest interpretation so as to encompass all such modifications and similar arrangements and procedures.

What is claimed is:

1. A polysilicon layer formed on a substrate, comprising:
    a plurality of lateral growth crystal grains arranged in parallel with a plurality of grain boundaries therebetween and extended in a grain direction, each of the lateral growth crystal grains including a plurality of nano-trenches formed on a top surface of the lateral growth crystal grains, a longitudinal direction of the nano-trenches substantially perpendicular to the grain direction of the lateral growth crystal grains, wherein the nano-trenches have a depth smaller than about 20 nm, and a distance D between two adjacent nano-trenches is in a range of about 0.5 μm-5 μm.

2. The polysilicon layer according to claim 1, wherein the surface of the polysilicon layer has a root-mean-square (RMS) roughness no greater than 5 nm.

3. A polysilicon layer formed on a substrate, comprising:
    a plurality of lateral growth crystal grains having a strip shape and arranged in parallel with a plurality of grain boundaries therebetween and extended in a grain direction, each of the lateral growth crystal grains including a plurality of nano-trenches formed on a top surface of the lateral growth crystal grains, a longitudinal direction of the nano-trenches substantially perpendicular to the grain direction of the lateral growth crystal grains, wherein the nano-trenches have a depth smaller than about 20 nm, and a distance D between two adjacent nano-trenches is in a range of about 0.5 μm-5 μm,
    wherein the polysilicon layer is formed by a laser annealing method of partially overlapping laser irradiation areas, and the melted amorphous silicon and melted polysilicon respectively crystallize and re-crystallize in each of laser irradiation areas, wherein a first irradiation area and a second irradiation area partially overlapping the first irradiation area are respectively irradiated by a first laser shot and a second laser shot, and the first and second laser shots each have a laser energy intensity profile in a direction of said moving that increases in said direction from 10% of the respective first and second laser shot's maximum energy intensity to 90% of the respective first and second laser shot's maximum laser energy intensity such that the laser energy intensity over a lateral distance, the lateral distance being larger than a distance d of movement of a substrate with an amorphous silicon thereon.

4. The polysilicon layer according to claim 3, wherein the surface of the polysilicon layer has a root-mean-square (RMS) roughness no greater than 5 nm.

5. The polysilicon layer according to claim 3, wherein the polysilicon layer is formed by the steps of:
  (a) forming the amorphous silicon layer on the substrate;
  (b) irradiating the first irradiation area of the substrate by the first laser shot with sufficient energy to melt the amorphous silicon in the first irradiation area, whereupon the melted amorphous silicon crystallizes to form polysilicon;
  (c) moving the substrate a step of distance d, and irradiating the second irradiation area of the substrate by the second laser shot with sufficient energy to melt the amorphous silicon in the second irradiation area and a portion of the polysilicon in the first irradiation area overlapping the second irradiation area, whereupon the melted amorphous silicon and melted polysilicon crystallize and re-crystallize, respectively; and
  (d) repeating step (c) until the amorphous silicon layer on the substrate is transformed completely into a polysilicon layer.

6. The polysilicon layer according to claim 3, wherein the first and second laser shots each have a laser energy intensity profile in a direction of said moving that increases in said direction from 10% of the respective first and second laser shot's maximum energy intensity to 90% of the respective first and second laser shot's maximum laser energy intensity such that the laser energy intensity over a lateral distance, the lateral distance being larger than the distance d of movement of the substrate in said step (c).

7. The polysilicon layer according to claim 3, wherein said crystallizing includes crystallizing the melted amorphous silicon layer from the outer edges of a center of the first irradiation area so as to form a first polysilicon region, and developing a plurality of first polysilicon protrusions each having a width in the direction of said moving and a length corresponding to a length of the first laser shot, perpendicular to the width.

8. The polysilicon layer according to claim 3, wherein said step (c) includes completely melting the first polysilicon protrusions while completely melting the amorphous silicon in the second irradiation area.

9. The polysilicon layer according to claim 3, wherein said step (c) includes applying the second laser shot in the second irradiation area until the amorphous silicon therein is melted completely, and then crystallizing the melted amorphous silicon in the second irradiation area from outer edges to the center of the second irradiation area so as to form a second polysilicon region, said crystallizing the melted amorphous silicon in the second irradiation area including developing a plurality of second polysilicon protrusions in the second polysilicon region, each having a width in the direction of said moving and a length corresponding to a length of the second laser shot, perpendicular to the width.

10. The polysilicon layer according to claim 1, wherein each of the lateral growth crystal grains has a strip shape extended in the grain direction, and the grain direction is substantially parallel to the grain boundary.

11. The polysilicon layer according to claim 1, wherein each of the adjacent nano-trenches connected to each other to form a continuous nano-trench.

12. A polysilicon layer formed on a substrate, comprising:
  a plurality of lateral growth crystal grains arranged in parallel with a plurality of grain boundaries therebetween and extended in a grain direction, and
  a plurality of continuous nano-trench formed on a top surface of the lateral growth crystal grains and arranged in parallel, a longitudinal direction of the continuous nano-trenches substantially perpendicular to the grain direction of the lateral growth crystal grains, wherein the continuous nano-trenches have a depth smaller than about 20 nm, and a distance D between two adjacent continuous nano-trenches is in a range of about 0.5 µm -5 µm.

13. The polysilicon layer according to claim 12, wherein each of the lateral growth crystal grains has a strip shape extended in the grain direction, and the grain direction is substantially parallel to the grain boundary.

14. The polysilicon layer according to claim 13, wherein the longitudinal direction of the continuous nano-trenches and the grain boundary of the crystal grains form an angle in a range of about 60 degrees to 90 degrees.

15. The polysilicon layer according to claim 12, wherein each of the continuous nano-trenches including a plurality of nano-trenches connected to each other, and each of the lateral growth crystal grains including a plurality of nano-trenches formed on the top surface of the lateral growth crystal grains.

16. A polysilicon layer formed on a substrate, comprising:
  a plurality of lateral growth crystal grains having a strip shape and arranged in parallel with a plurality of grain boundaries therebetween and extended in a grain direction, and
  a plurality of continuous nano-trench formed on a top surface of the lateral growth crystal grains and arranged in parallel, a longitudinal direction of the continuous nano-trenches and the grain direction of the lateral growth crystal grains formed with an angle in a range of about 60 degrees to 90 degrees, wherein the continuous nano-trenches have a depth smaller than about 20 nm.

* * * * *